United States Patent
Rajkumar et al.

(10) Patent No.: US 6,844,877 B1
(45) Date of Patent: Jan. 18, 2005

(54) AUTOMATED MIRRORING OF COMPONENTS

(75) Inventors: Parapura T. Rajkumar, Cambridge, MA (US); Kirk Haller, Acton, MA (US); Mark G. Gibson, Concord, MA (US); Heung-Wing Li, Chelmsford, MA (US)

(73) Assignee: SolidWorks Corporation, Concord, MA (US)

( * ) Notice: Subject to any disclaimer, the term of this patent is extended or adjusted under 35 U.S.C. 154(b) by 234 days.

(21) Appl. No.: 10/008,746

(22) Filed: Nov. 5, 2001

(51) Int. Cl.[7] .............................................. G06T 17/00
(52) U.S. Cl. ...................................................... 345/420
(58) Field of Search ................................ 345/770, 619, 345/419; 703/2

(56) References Cited

U.S. PATENT DOCUMENTS

| | | | | |
|---|---|---|---|---|
| 4,701,752 A | * | 10/1987 | Wang .......................... | 345/655 |
| 5,237,647 A | * | 8/1993 | Roberts et al. .............. | 345/419 |
| 6,212,484 B1 | * | 4/2001 | Chen ............................. | 703/2 |
| 6,323,859 B1 | * | 11/2001 | Gantt .......................... | 345/419 |
| 6,417,865 B1 | * | 7/2002 | Bou ............................ | 345/619 |

OTHER PUBLICATIONS

Schlieve, "Illustrated AutoCAD Release 11", 1991, pp. 79–82.*
Elliott et al., "Inside 3D Studio MAX 2", 1998, p. 34.*
Schlieve, "Illustrated AutoCAD Release 11", 1991, pp. 79–82.*
Elliott et al., "Inside 3D Studio MAX 2", 1998, p. 34.*

* cited by examiner

*Primary Examiner*—Mark Zimmerman
*Assistant Examiner*—Lance W. Sealey
(74) *Attorney, Agent, or Firm*—James V. Mahon; Clifford Chance US LLP

(57) ABSTRACT

Automatically generating components of an object modeled in a three-dimensional modeling space by a computer aided design system includes positioning a plane in the three-dimensional modeling space to (i) logically subdivide the modeling space into a first division that includes an existing component and a second division in which a reproduction of the existing component is to be located and (ii) to define a reference geometry for creation of the reproduction of the existing component. A number of geometrically transformed components are computed by applying a series of different transformations to the existing component such that each transformed component has a different orientation. A reproduction of the existing component is constructed such that the existing component and the reproduction are symmetrical to each other with respect to the plane.

29 Claims, 12 Drawing Sheets

AUTOMATED MIRRORING OF COMPONENTS

BACKGROUND OF THE INVENTION

Computer-aided design (CAD) software allows a user to construct and manipulate complex three-dimensional (3D) models of assembly designs. A number of different modeling techniques can be used to create a model of an assembly. These techniques include solid modeling, wire-frame modeling, and surface modeling. Solid modeling techniques provide for topological 3D models, where the 3D model is a collection of interconnected edges and faces, for example. Geometrically, a 3D solid model is a collection of trimmed surfaces. The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these, and other, modeling techniques, such as parametric modeling techniques.

Parametric modeling techniques can be used to define various parameters for different components of a model, and to define relationships between those components based on relationships between the various parameters. Solid modeling and parametric modeling can be combined in CAD systems supporting parametric solid modeling.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies. Parts and subassemblies are hereinafter collectively referred to as components.

Often assemblies and subassemblies have one or more planes of symmetry about which parts and subassemblies appear. Components that appear in symmetric locations on both sides of a plane of symmetry are referred to herein as mirrored components. One way in which a component may be mirrored is by creating a reflection of the original component such that a left-hand and right-hand version of a component exists.

Henceforth, this type of mirrored component will be referred to as a "truly mirrored" component (or part). A second way in which a component may be mirrored is to create a new component by replicating the original component and positioning the new component at a symmetric location within the assembly. Thus, only one version of the component exists. Henceforth, this type of mirrored component will be referred to as a replicated component or simply a copy. In the case where a subassembly is mirrored about a plane of symmetry, combinations of truly mirrored components and replicated components may be present.

To create a truly mirrored component such that a left-hand and right-hand adaptation of a component exists, all entities (e.g., a solid model's lines, edges, and faces) in the original component are reflected about a specified plane. Therefore, the original component is not simply copied. Rather, the original component is transformed, for example, using a scaling transformation that may be represented as the 3×3 matrix [1,0,0 0,−1,0 0,0,1].

The SolidWorks®2000 CAD system available from SolidWorks Corporation of Concord, Mass., can create a truly mirrored part about a specified face or plane. However, SolidWorks 2000 is not capable of creating a truly mirrored part in the context of an assembly. The original part document must first be opened in a window and the original part must be the sole component in that window. The design engineer then must select a face, or alternatively create a plane and select that plane, to specify the face or plane about which to mirror the part. The design engineer then activates a command that instructs the system to construct the mirrored part. After the mirrored part is constructed, the mirrored part must be saved to a file. The design engineer then returns to the window containing the assembly and inserts the original part's file, if necessary, and inserts the mirrored part's file. The truly mirrored part must also be positioned in the assembly using commands (which may be accessed via the user interface) that translate and rotate the truly mirrored part.

To create a replicated component, the design engineer creates a copy of the component. Some CAD systems may require that each part in a subassembly be copied one at a time. However, SolidWorks 2000 can create a copy of an entire subassembly using a single copy command. Generally, CAD systems provide commands that copy components. However, after a component is copied, the design engineer must determine the correct position in the assembly where the replicated component should be placed such that the original component and the replicated component appear in symmetric locations on opposite sides of a plane of symmetry. The design engineer then must determine and apply the appropriate transformations (e.g., rotations and/or translations) to correctly place the component.

Components may have relationships with other components, such as parametric, positional, and hierarchical relationships. Generally, a design engineer would want these relationships preserved by replicated and truly mirrored components.

A parametric relationship is a geometric relationship that establishes a dependency between two or more features that belong to different components. When the value of an attribute of one feature is modified, the value of an attribute of another feature may be automatically modified in response. For example, the diameter of a hole may be dependent on the diameter of a screw inserted into the hole, and vice versa. Although some CAD systems may require a design engineer to re-create parametric relationships with respect to replicated and truly mirrored components, Solid-Works 2000 does not require parametric relationships to be re-created for mirrored components. The part model for a new truly mirrored part references the part model for the original part in such a way as to preserve the parametric relationships in the new truly mirrored part that exist in the original part. A replicated component created using Solid-Works 2000 also retains the parametric relationships because the attributes that define the parametric relationships are included in the replicated component.

Although parametric relationships may be retained when a mirrored component is created, typically hierarchical relationships are not retained. When a subassembly is mirrored about a plane of symmetry, the hierarchical structure of the subassembly is not preserved. Rather, the mirrored subassembly is created as an assortment of mirrored parts, which are in a fixed position in space in the parent subassembly or assembly. The design engineer must assemble the mirrored components to form a hierarchical structure, such as a subassembly, and integrate the components within the overall assembly structure. To preserve the design intent, the design engineer must recreate the structure of each original subassembly by reconstructing the hierarchical relationships established in the original components.

Other relationships that are not typically preserved by mirrored components are mating relationships, which are positional relationships. A mating relationship is a geometric relationship that positions one component with respect to another component and defines how those components move with respect to other components. For example, a mating relationship may ensure that two parts remain coincident, tangent, or perpendicular to one another. When components are mated, the components are always precisely positioned with respect to one another within an assembly. The design engineer must re-establish mating relationships for the mirrored components using commands provided by the CAD system.

Although hierarchical and mating relationships must be re-created, generating replicated and truly mirrored components frees the design engineer from completely redesigning the components. Additionally, a replicated part created using SolidWorks 2000 has the advantage of conserving memory because SolidWorks 2000 does not store an additional part model for a replicated part. However, SolidWorks 2000 does create and store an additional part model when a truly mirrored component is generated.

Another advantage that replicated parts have over truly mirrored parts in the SolidWorks 2000 CAD system is that features in a replicated part are discernable. Given that a replicated part uses the same part model, features that are added, deleted, or modified on the replicated part are also added, deleted, or modified on the original part. Conversely, any changes to the original part are applied to the replicated part.

When SolidWorks 2000 creates a truly mirrored part, a new part model is created and individual features present in the original part are combined into one feature in the truly mirrored part. Therefore, features may be added to a truly mirrored part, but cannot be modified or deleted. However, SolidWorks 2000 establishes parametric relationships to ensure that a feature modification in the original component is reproduced in the truly mirrored component.

Commercially available CAD systems may create a bill of materials that lists all the parts in an assembly and specifies the quantity of each part used in the assembly. For manufacturing considerations, the design engineer generally wants the number of unique parts in an assembly to be kept to a minimum. This simplifies the manufacturing tasks and reduces manufacturing costs. Therefore, two quantities of one particular part in an assembly are preferable over having one left-hand version and one right-hand version of a part.

A common problem encountered by design engineers that generate mirrored components is producing a correct bill of materials for the assembly. A correct bill of materials should include separate part numbers for the original component and the truly mirrored component to indicate that two unique components are required. Some CAD systems may not make the distinction that truly mirrored parts are unique and may produce an incorrect bill of materials. To overcome this problem, design engineers may choose to spend the time and effort to redesign components rather than generate truly mirrored components to ensure that the bill of materials will list two separate and unique parts, one for the original part and one for the truly mirrored part.

The bill of materials may also misrepresent the original part and a corresponding replicated part as two unique parts, although when a part is replicated only one version of the part exists. For example, a replicated mirrored component may be created from a part that is a standard screw. The system may not account for two quantities of one standard screw, but rather account for one standard screw and one mirrored standard screw.

Another situation that causes an incorrect bill of materials to be generated arises when one part represents an entire subassembly. In order to create a mirrored component of an entire subassembly, some commercially available products require a design engineer to create one part that consists of the entire subassembly, and therefore, an erroneous bill of materials may be generated that represents the mirrored subassembly as one part rather than numerous parts.

The current problems encountered when generating mirrored subassemblies, including retaining positional and hierarchical relationships, and generating a correct bill of materials, may be overcome by having a mechanism that automatically creates mirrored subassemblies with a minimum amount of interaction from the design engineer. Such an automated mechanism would save the design engineer a considerable amount of time and effort during the 3D modeling process. Furthermore, maximizing the intelligent re-use of existing components as replicated parts and minimizing the construction of additional unique components in the form of truly mirrored parts is desirable in order to reduce manufacturing costs, and to reduce the number of files a design engineer or Product Data Management (PDM) system needs to manage.

SUMMARY OF THE INVENTION

In general, in one aspect, the invention features a method of mirroring a component of a three-dimensional object. The method of mirroring includes receiving data to select a first component of the three-dimensional model, analyzing candidate orientations for reproducing the component, and creating a new component that is a reproduction of first component and based on a position of the first component with respect to a surface.

Implementations may include one or more of the following features. The surface may be a plane that divides the modeling space and may be positioned by the user. The candidate orientations may be determined by applying different transformations to the first component. Manners in which a new component may be created include applying one of the different transformations to the first component and reflecting the first component.

The first component may include sub-components. New components may be created for each sub-component. Each new component may be a replicated version or a reflected version of the corresponding sub-component. A bill of materials includes a different line item for a sub-component and the corresponding reflected new component; whereas, for a sub-component and the corresponding replicated new component, the bill of material includes instances of the same line item.

Various aspects of the invention may be implemented in computer systems that include a data storage system for the three-dimensional object data, a computer processor coupled to the data storage system, a program storage system (which may be the same as the data storage system), and an output display system. The program storage system can include instructions to configure the processor to perform method processes disclosed herein.

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

The present invention automatically creates mirrored components (i.e., parts and subassemblies). Mirrored components may consist of replicated components, truly mirrored components, or combinations thereof. The design engineer may select which components to re-use in an assembly and may specify whether to create a replicated component or a truly mirrored component for each original component selected. Additionally, the present invention may automatically determine from which components to create replicated components and from which components to create truly mirrored components, without user intervention.

The present invention automatically copies and positions a replicated component in such a way that the location of the replicated component is symmetric to the location of the original component; whereas, a truly mirrored component is reflected about a plane of symmetry and takes the form of a left-hand version of a right-hand component. The present invention also preserves the hierarchical structure, parametric relationships, and mating relationships amongst and between the mirrored components.

The way in which mirrored components are created enables the bill of materials to correctly list the mirrored components. An original component and a component that is replicated on the opposite side of a plane of symmetry are listed as two quantities of one component. The component pair consisting of an original component and a truly mirrored component is listed as a single quantity for each of two unique components (i.e., a left-hand version and a right-hand version of a component).

By providing an automated process for creating mirrored subassemblies comprised of truly mirrored components and replicated components, the present invention thereby enhances the flexibility and functionality of a computerized modeling system.

Figure 1:
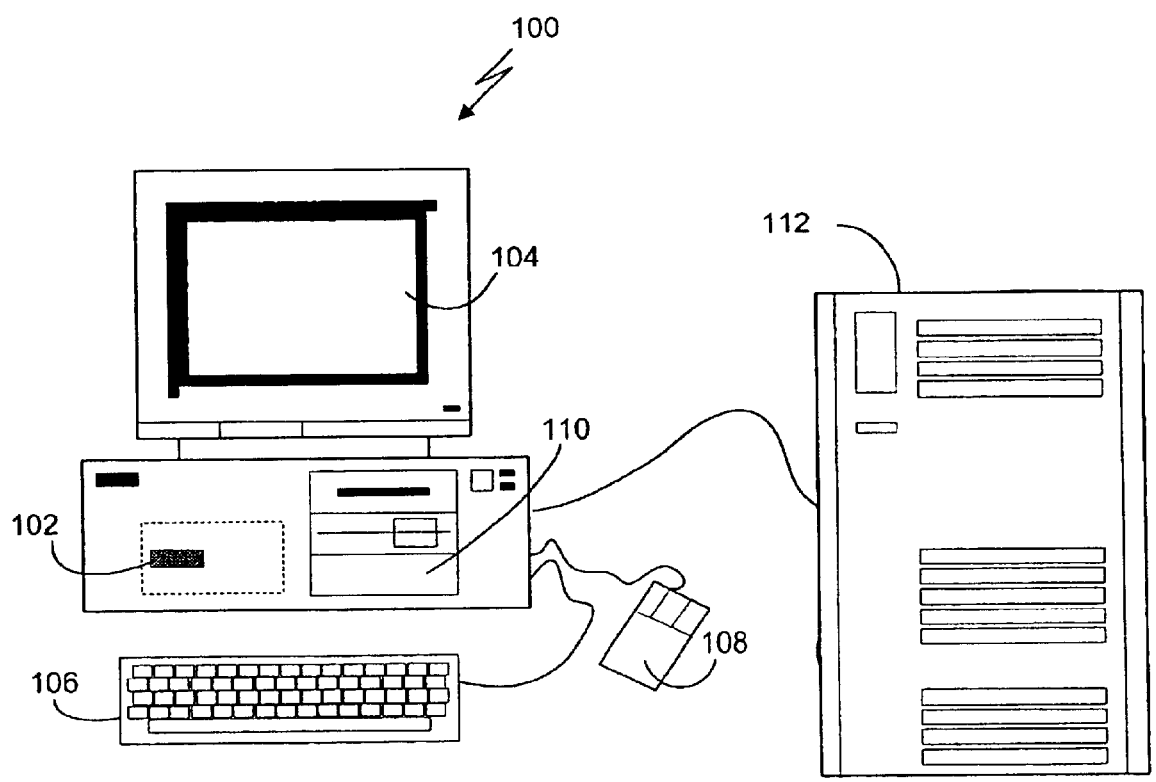
FIG. 1 is a diagram of a computer system.

FIG. 1 shows a computerized modeling system 100 that includes a CPU 102, a CRT 104, a keyboard input device 106, a mouse input device 108, and a storage device 110. The CPU 102, CRT 104, keyboard 106, mouse 108, and storage device 110 can include commonly available computer hardware devices. For example, the CPU 102 can include a Pentium-based processor. The mouse 108 may have conventional left and right buttons that the user may press to issue a command to a software program being executed by the CPU 102. Other appropriate computer hardware platforms are suitable as will become apparent from the discussion that follows. Such computer hardware platforms are preferably capable of operating the Microsoft Windows NT, Windows 95, Windows 98, Windows 2000, or UNIX operating systems.

Computer-aided design software is stored on the storage device 110 and is loaded into and executed by the CPU 102. The software allows the design engineer to create and modify a 3D model and implements aspects of the invention described herein. The CPU 102 uses the CRT 104 to display a 3D model and other aspects thereof as described later in more detail. Using the keyboard 106 and the mouse 108, a design engineer can enter and modify data for the 3D model. The CPU 102 accepts and processes input from the keyboard 106 and mouse 108. The CPU 102 processes the input along with the data associated with the 3D model and makes corresponding and appropriate changes to that which is displayed on the CRT 104 as commanded by the modeling software. Additional hardware devices may be included in the computerized modeling system 100, such as video and printer devices. Furthermore, the computerized modeling system 100 may include network hardware and software thereby enabling communication to a hardware platform 112. Those of ordinary skill in the art will appreciate that the invention could also be used in conjunction with other computer-aided design software that addresses applications other than mechanical design.

In one embodiment, the underlying data structures of the modeling software behave parametrically. For example, the geometry, display attributes, and annotations displayed as part of the model on the CRT 104 are updated as needed when a design engineer changes the model. Thus, if a vertex of an object is moved and an annotation having an arrow and a leader points to the vertex of the object, the annotation will move accordingly. Dimensions also behave parametrically. For example, a change in an underlying model may affect a dimension displayed in a viewing area on the CRT 104. The dimension will then be updated as needed, including the location of the dimension and the dimension value.

In one embodiment, the modeling system is a solid modeling system. The model is an assembly of solid model components. The solid model may have relationships that parametrically constrain the definitions of one or more components. If a parametrically constrained relationship exists between two components, changing a geometric feature of one component may change a geometric feature of the other component. For example, a component that is a shock rod may compress and decompress thereby affecting the way in which a connecting spring component coils around the shock rod.

Figure 2:
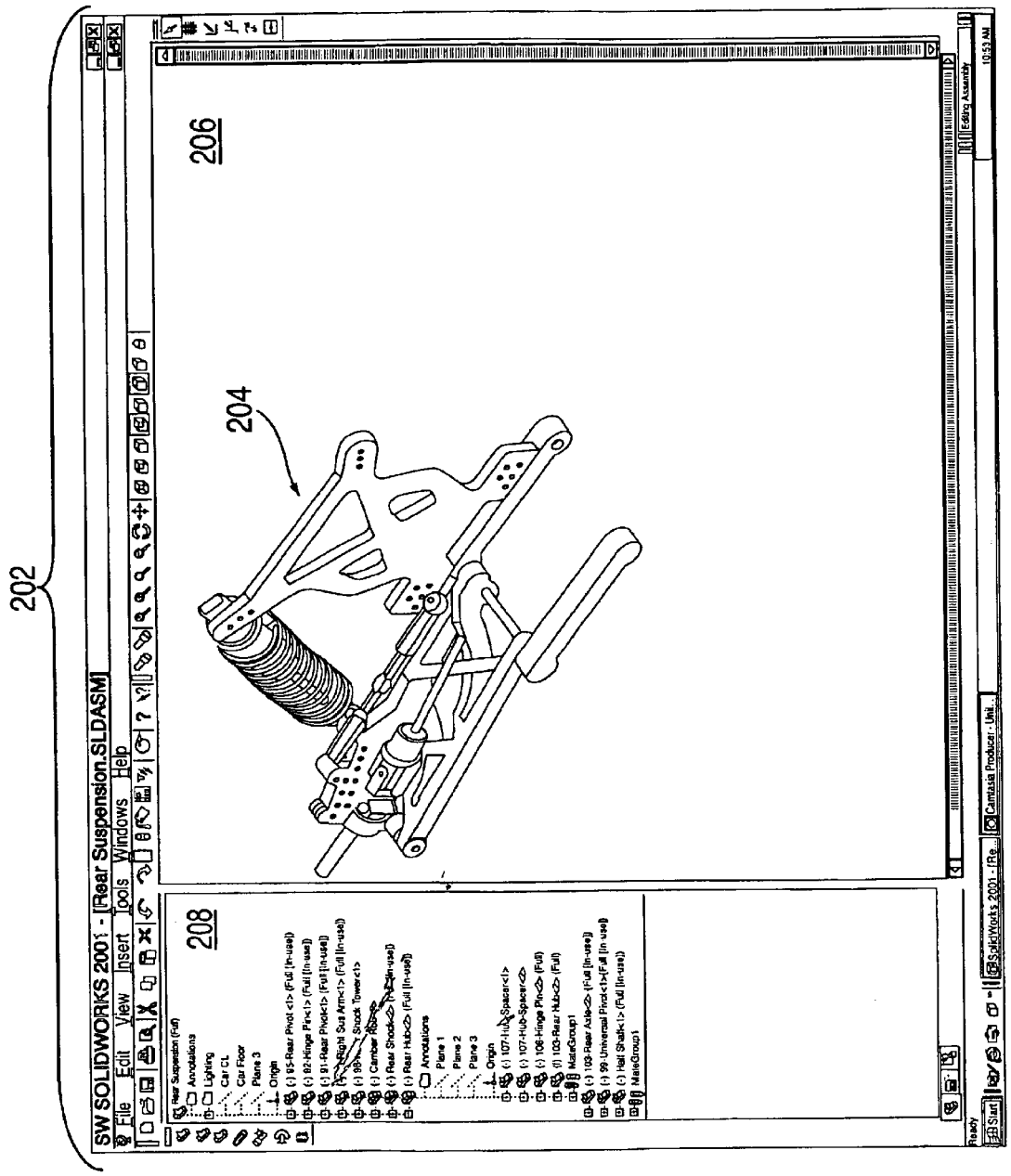
FIG. 2 is an illustration of an assembly model displayed in a window.

FIG. 2 shows a window 202 displayed on the CRT 104 and generated by a CAD software system. The window 202 is a conventional computer-generated window that can be programmed by one of ordinary skill in the art using conventional, commercially available, software programming tools, such as those available from Microsoft Corporation of Redmond, Wash.

A computer-generated 3D model 204 is displayed within a modeling portion 206 of the window 202. The design engineer can construct and modify the 3D model 204 in a conventional manner. The surfaces of the 3D model 204 can be displayed, or the 3D model 204 can be displayed using solid lines and dashed lines to show visible edges and hidden edges, respectively, of the 3D model. Implementations also may include other window areas, such as a feature manager design tree 208, which helps the design engineer visualize and manipulate the model 204 shown in the modeling portion 206.

Figure 3:
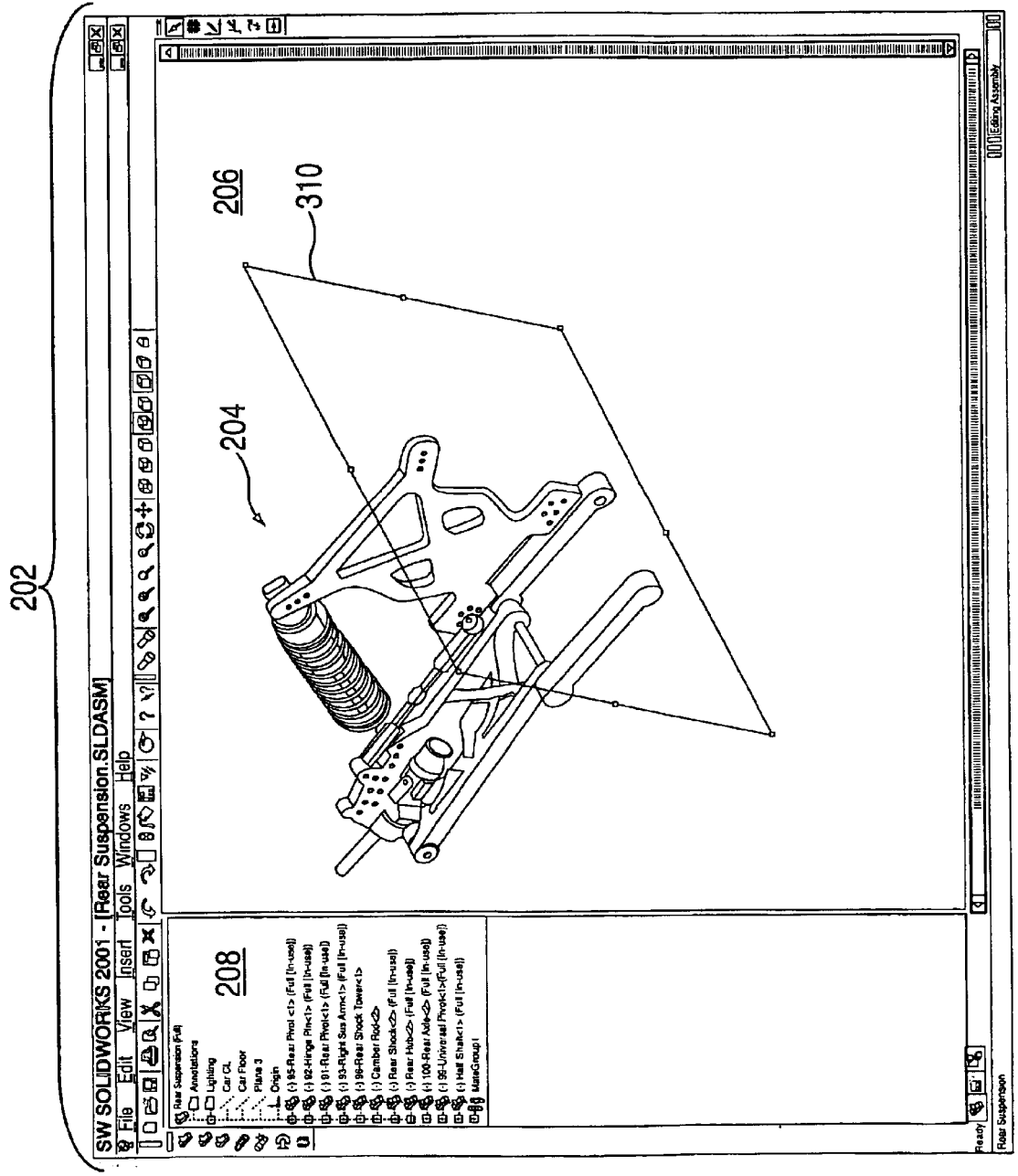
FIG. 3 is an illustration of an assembly model and a plane of symmetry displayed in a window.

FIG. 3 shows the 3D model 204 displayed within the modeling portion 206 of the window 202 after a design engineer decides to generate mirrored components. The system displays a plane of symmetry 310 about which the model 204, or selected components of the model 204, will be mirrored. The location of the plane of symmetry is determined by the design engineer and positioned by using commands made available to the user via the CAD system's user interface.

Figure 4:
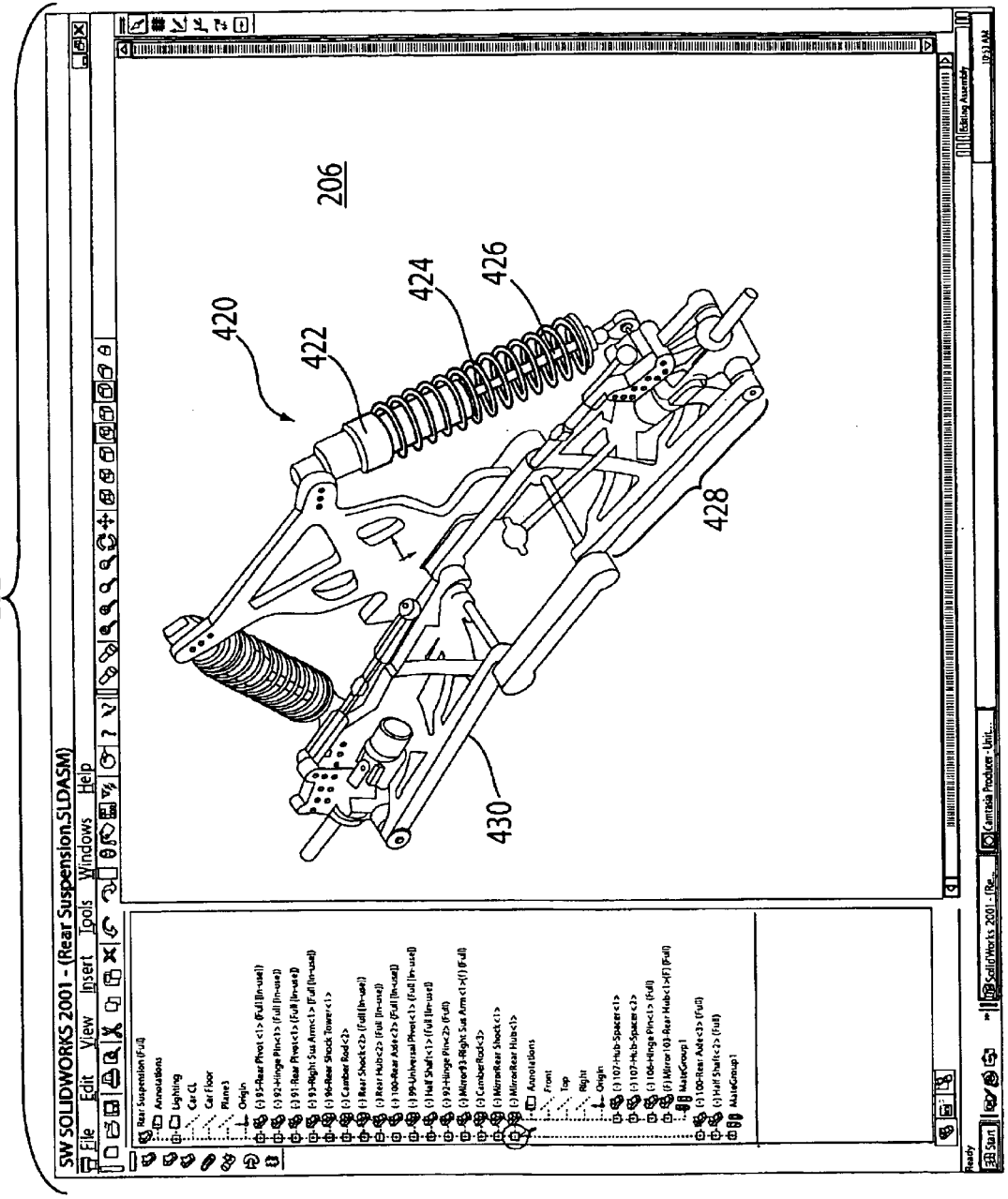
FIG. 4 is an illustration of a mirrored assembly displayed in a window.

FIG. 4 shows a mirrored assembly 420 displayed in the modeling portion 206 of the window 202. Among the components that are replicas (i.e., exact copies) of original components are the mirrored shock body 422, the mirrored spring 424, and the mirrored shock rod 426. The suspension arm 428 is a truly mirrored part, which is a reflected version of the original suspension arm 430.

The automatic creation of mirrored components may be activated by a command accessible via a graphical user interface. When the design engineer activates the command, without user intervention, each part may be mirrored and placed in the correct position on the opposite side of a specified plane of symmetry. The present invention can automatically determine which components may be replicated and which may be truly mirrored, with the goal of replicating a component if possible. Replicating a component not only reduces manufacturing costs but also contributes to the overall efficiency of processes within a CAD system.

Figure 5:
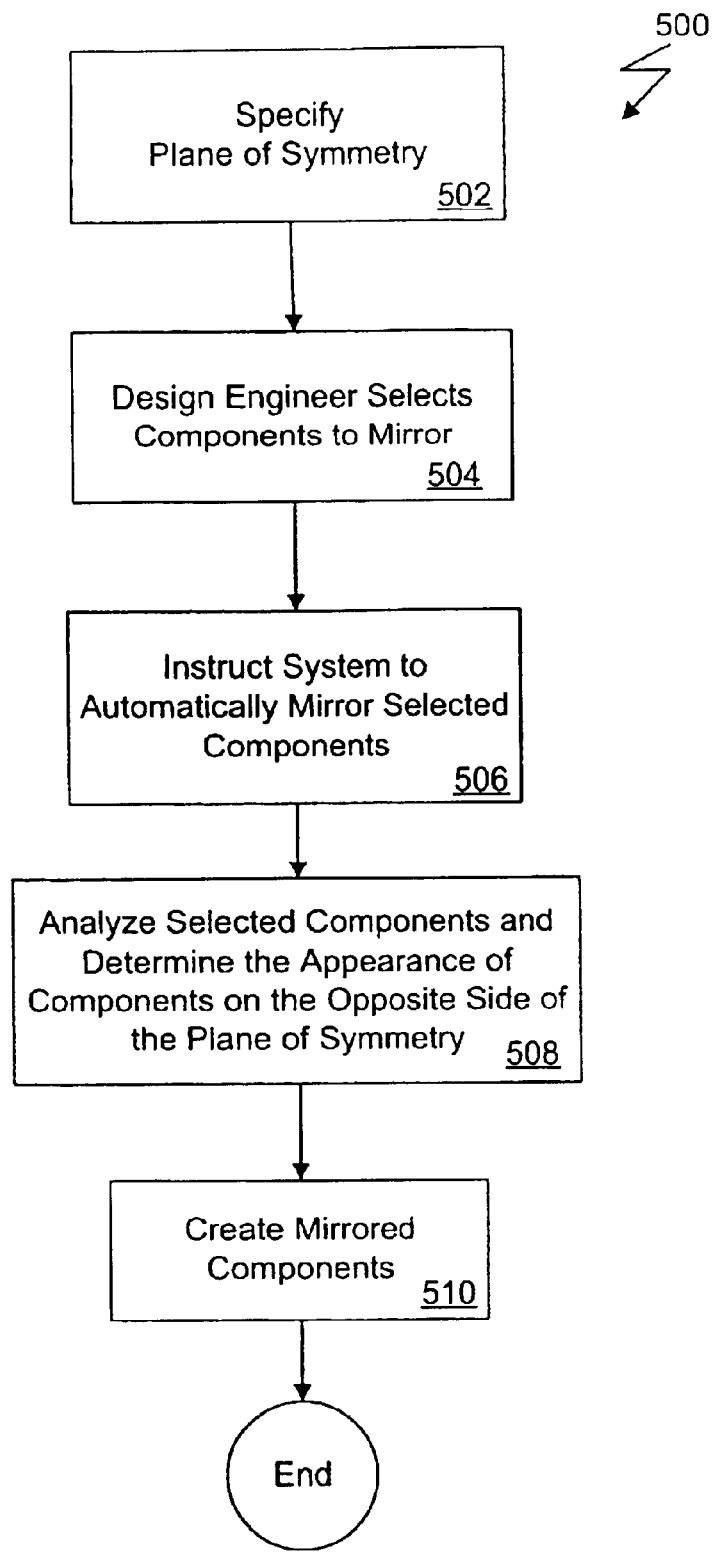
FIG. 5 is a flowchart of the steps that create a mirrored subassembly.

FIG. 5 is a flowchart of a process that creates mirrored subassemblies, which begins when a design engineer decides to mirror components in an assembly. First, the design engineer specifies a plane of symmetry (step 502) about which one or more components will be mirrored. The design engineer may specify an existing plane or planar face, or may use commands available in the CAD system to create a plane and position the plane in such a way that the plane may be used as a plane of symmetry. The plane of symmetry is stored with the model and subsequently used to create mating relationships, which is later discussed.

The design engineer then selects a set of components to mirror (step 504). The set of components may consist of all components, a single part, a subassembly, or a combination of parts and subassemblies.

The design engineer may then instruct the system to automatically mirror the selected components (step 506). This may be accomplished by selecting a command from the user interface. For example, in one embodiment, a "Mirror Components" command may be selected from a pull-down menu that contains a variety of insertion commands, in addition to the "Mirror Components" command. The system then analyzes the selected components and determines how the components should appear on the opposite side of the plane of symmetry (step 508). The analysis may also entail determining which parts to copy to the opposite side of the plane of symmetry and which parts to transform into truly mirrored parts. As the analysis is taking place, a dialog box may be displayed to inform the design engineer whether the mirror operation will copy a given part to the opposite side of the plane of symmetry or truly mirror a given part (e.g., create a left-hand version of a right-hand part). The design engineer may use the dialog box to confirm or override this determination.

Rather than having the system automatically make the final determination regarding which parts to copy and which to truly mirror, one embodiment allows the design engineer to make the determination. The design engineer may prefer that a part be copied rather than truly mirrored to minimize the number of unique parts used in an assembly. Thus, manufacturing concerns such as costs play a role in the decision regarding how a part should be mirrored.

Figure 6:
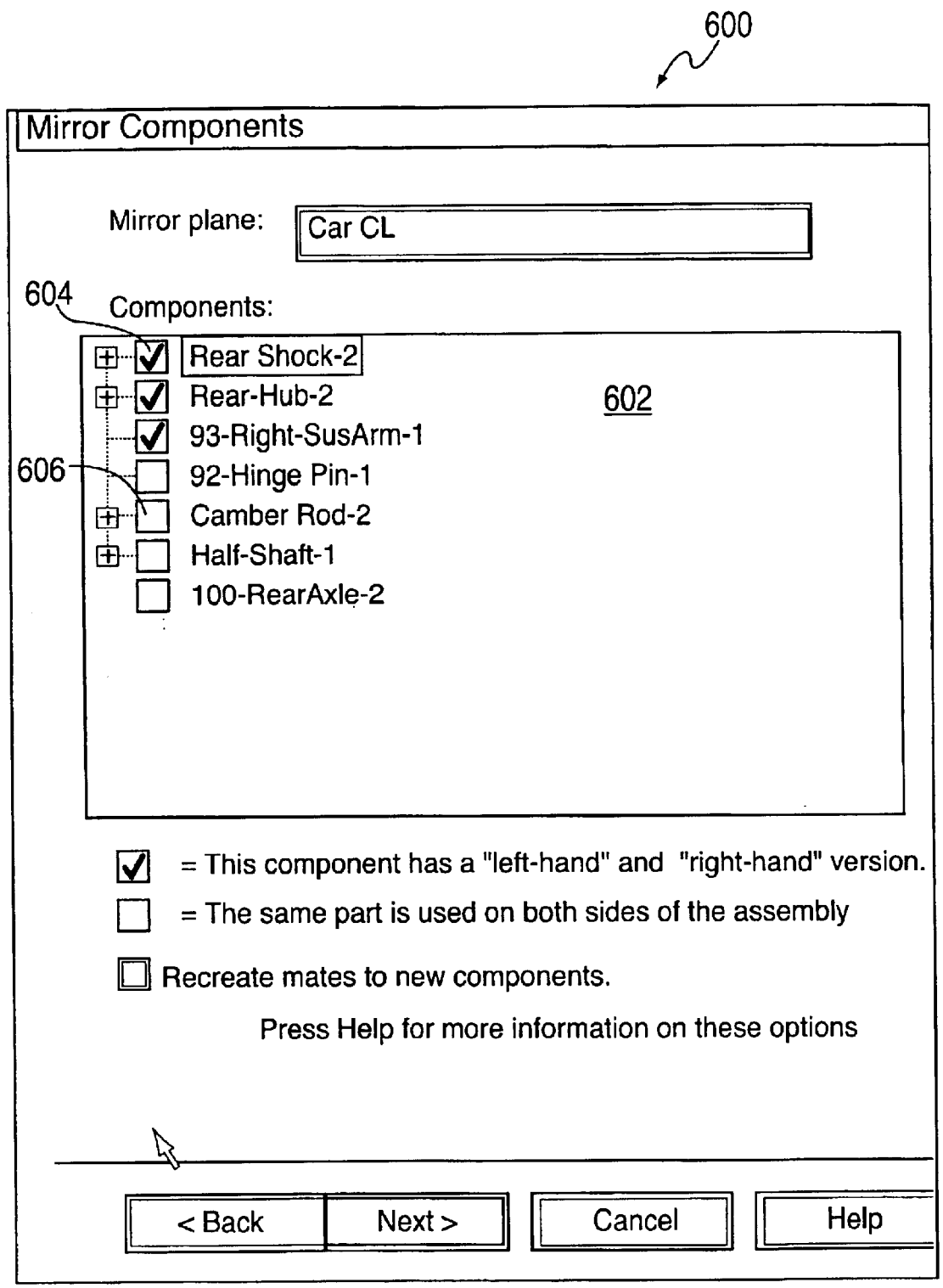
FIG. 6 is an illustration of a dialog box.

FIG. 6 illustrates a dialog box 600 that may be displayed to enable the design engineer to specify which parts to copy and which to truly mirror. Implementations may display the dialog box 600 prior to the analyses step 508, thereby allowing the design engineer to direct the system to copy or truly mirror a component, or to automatically determine whether to copy or truly mirror the component. Implementations may also display the dialog box after the system automatically determines which components to copy and which to truly mirror, thereby allowing the design engineer to override the automatic mirroring determination.

Figure 8:
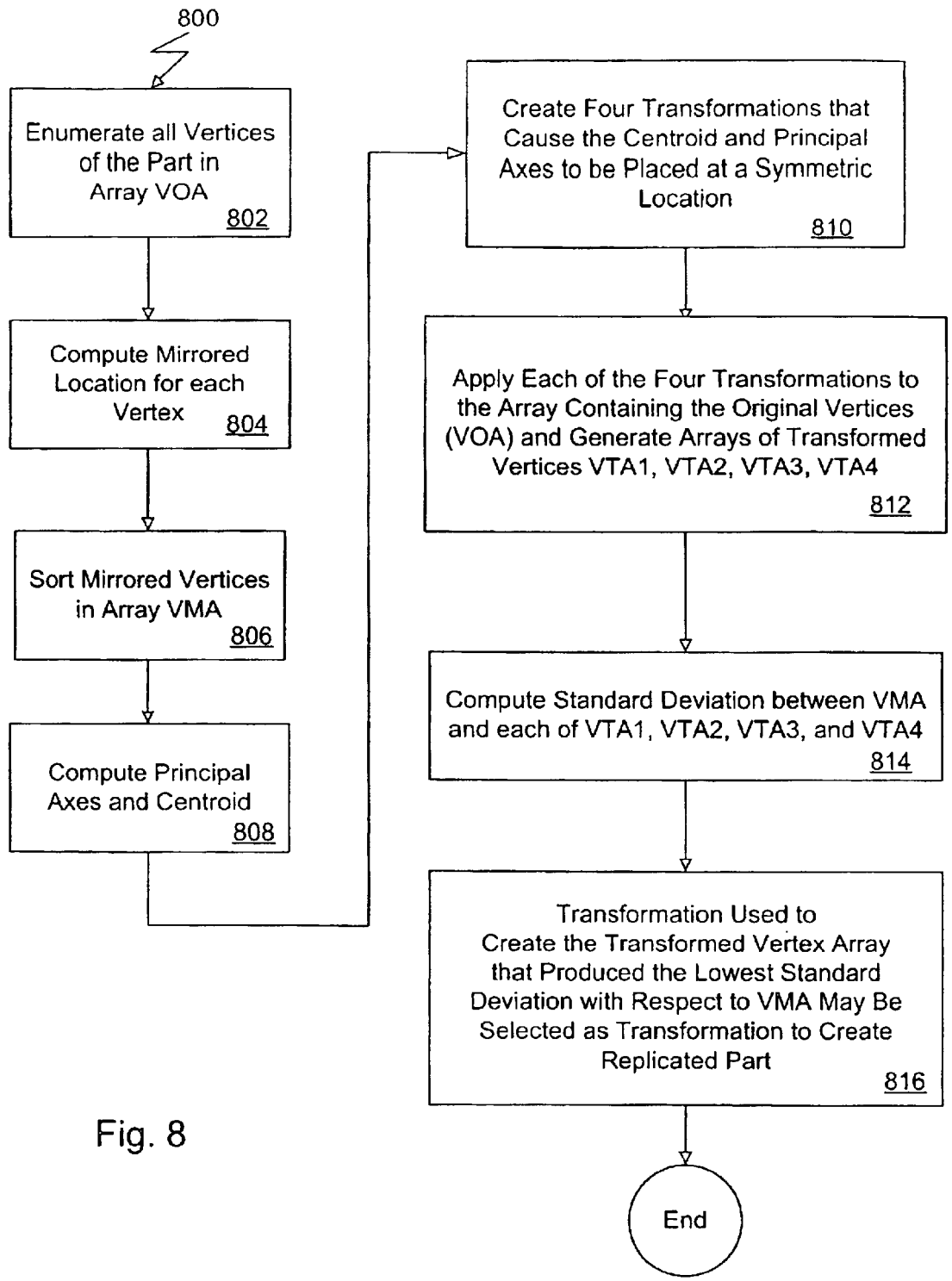
FIG. 8 is a flowchart of steps that determine an appropriate transformation.

The components that will be mirrored may be displayed as a list 602. A checkmark before a component name contained in the list 602, such as the checkmark 604 displayed to the left of the text "Rear Shock 2," designates that the component will have a left-hand and right-hand version (i.e., truly mirrored). An item in the list 602 that does not have a checkmark to the left of the component name, such as the empty box 606 displayed to the left of the text "Camber Rod-2," designates that a component will be replicated. The design engineer may add or remove a checkmark to override a determination that was automatic or to initially specify the desired mirror operation. In some implementations, each checkbox may also have a third state (e.g., a grayed-out or unselected state) to indicate that the system should make the determination automatically. Furthermore, the dialog box 600 may inform the design engineer about the automatic process that is taking place when components are analyzed to determine how the components will be generated on the opposite side of the plane of symmetry (step 508 in FIG. 5). One method of automatic determination, discussed further with respect to FIG. 8, is based on a standard deviation calculation.

Referring back to FIG. 5, the final step in the process that creates mirrored subassemblies is to create the mirrored components (step 510). To create a mirrored part that is a reflection of an existing part (i.e., a truly mirrored part), a new part having a new set of geometry (as well as other data that defines the part) is created based on the part being mirrored. The new part is included in the mirrored subassembly. To create a replicated mirrored part of an existing part, an instance of the original part is created and included (with a transformation) in the mirrored subassembly. Therefore, replicating a part does not result in a new unique part being created. Instancing an original component to create a replicated component has the desirable result of including two quantities of one component in the bill of materials, rather than one quantity of the original component and one quantity of the replicated component that is identical to the original component.

If an original component is selected for mirroring and an instance of the original component exists, a mirrored component is created from the original component only. The mirrored component may then be re-used, effectively creating a mirrored component of the original component's instance. Alternatively, the instance of the original component may be selected as a component to mirror.

A bill of materials may be created by a procedure that traverses the data structure that defines an assembly. The procedure may search for parts and subassemblies. The first time a part or subassembly is identified, the name given to the part or subassembly may be added to a list of names that will be included in the bill of materials. Associated with each item in the list is a data structure that defines a quantity. Initially, the quantity is set to one. Each time the procedure identifies another instance of a part or subassembly already contained in the list of names, the quantity associated with that part or subassembly is incremented by one. Truly mirrored parts are new parts that have unique identities, and therefore, are not included in the bill of materials as an additional quantity associated with the original part. Rather, truly mirrored parts are listed separately from the original part. A truly mirrored part has a unique name and associated quantity.

Often, the design engineer wants to re-use a standard or a symmetrical part (e.g., a screw, a spring, or a coil), rather than create a separate left-hand and right-hand version of the part. The present invention allows the design engineer to explicitly specify that a component should be copied to the opposite side of the plane of symmetry. Alternatively, the present invention can automatically maximize the re-use of existing parts by generating replicas of parts without any intervention by the design engineer.

When creating a replicated component, the present invention determines how the component should be placed on the opposite side of the plane of symmetry so that the replicated component appears as a mirror image of the original component. The part can assume one of a number of predetermined orientations. The orientations may be one of four orientations attained by rotating the part 0°, 180° about the part's principal x-axis, 180° about the part's principal y-axis, or 180° about the part's principal z-axis. The present invention automatically determines which of these four orientations (together with a translation) correctly positions a mirrored part during the analysis step 508 of FIG. 5.

Figure 7:
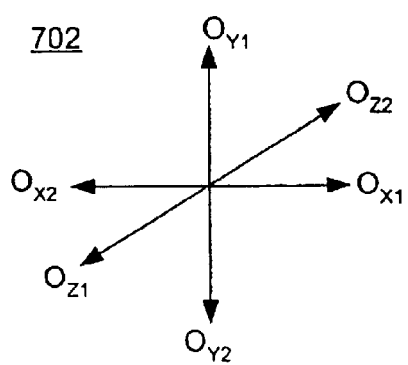
FIG. 7 is an illustration of possible mirrored positions for replicated components.
Figure 7:
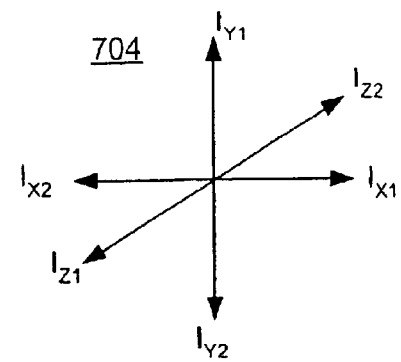
Figure 7:
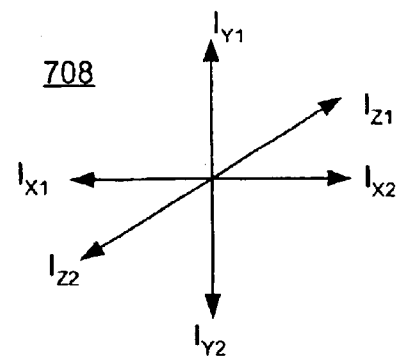
Figure 7:
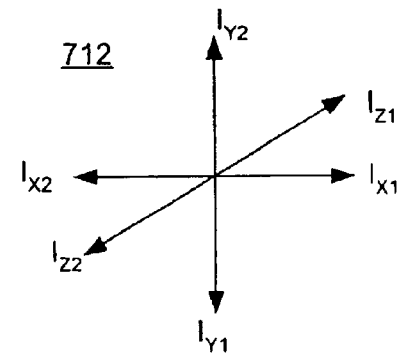
Figure 7:
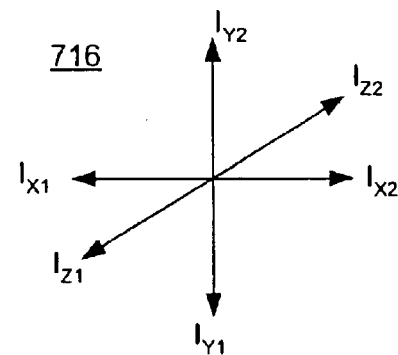

FIG. 7 illustrates four possible orientations that a part may assume when the part is copied to the opposite side of the plane of symmetry. The illustration shows the principal axes of the part in the part's initial orientation 702 and possible orientations of the principal axes after the part is replicated 704–716. The initial orientation of the principal axes 702 is shown in a similar manner as a right-handed coordinate system is often represented in an engineering textbook or document. The orientations of the principal axes after the part is replicated 704–716 maintain the right-handed coordinate system. Thus, the directions of the x, y, and z principal axes are preserved with respect to one another.

The first orientation 704 that a replicated part may assume results when the principal axes are not rotated. Therefore, the initial orientation 702 and the first orientation 704 of the replicated part's principal axes are identical. The second orientation 708 that a replicated part may assume may be produced by a 180° rotation about the y-axis of the principal axes, such that the x-axis of the principal axes in the second orientation 708 is aligned in the opposite direction of the x-axis of the principal axes in the initial orientation 702. In this second orientation 708, the direction of the y-axis is unchanged, whereas, the direction of the z-axis is opposite that of the initial orientation 702, thereby maintaining the right-handed coordinate system. The third orientation 712 may be produced by transforming the part 180° about the x-axis of the principal axes in the initial orientation 702. The fourth orientation 716 may be produced by transforming the part by 180° about the z-axis of the principal axes in the initial orientation 702.

FIG. 8 shows a procedure 800 that determines which of the four transformations just discussed will appropriately position a replicated part. In one embodiment, the transformations are 4×4 transformations that translate the part to the opposite side of the plane of symmetry and orient the part as illustrated in FIG. 7. Generally speaking, a 4×4 transformation matrix comprises a 3×3 matrix specifying rotation of an object as well as a fourth row and column specifying translation and scaling of the component.

A part consists of a number of vertices. To begin to create a replicated part, all the vertices in the original part are enumerated in an array, hereinafter referred to as VOA (step 802). The values of the vertices stored in VOA are in the context of the assembly's coordinate system. Therefore, the vertices stored in VOA have been transformed (e.g., rotated and/or translated) from the coordinate system of the part to the coordinate system of the assembly. The array VOA will later be used to determine which, if any, of the orientations discussed with reference to FIG. 7 are acceptable orientations for the replicated part.

In the next step, a mirrored location for each vertex is computed (step 804). The mirrored location is computed by translating the respective vertex in the direction initially toward the plane of symmetry on a path that is normal to the plane of symmetry by an amount equal to twice the distance of the respective vertex to the plane of symmetry. Thus, the original vertex and the mirrored vertex are equidistant to the plane of symmetry and are on opposite sides of the plane of symmetry. Furthermore, the mirrored vertices are in the context of the assembly's coordinate system because the operations were performed within the assembly space.

The mirrored vertices are then sorted in an array herein referred to as VMA (step 806). Sorting the mirrored vertices allows them to be easily compared to other sets of sorted vertices later in procedure 800 to evaluate the symmetry of the part and determine how to create a mirrored part. In one embodiment, the mirrored vertices are sorted in increasing lexical order by the values of the x-coordinate, y-coordinate, then z-coordinate.

In the next step, the principal axes of the original part and the centroid of the part are computed (step 808). This step 808 is performed to properly position the part on the opposite side of the plane of symmetry. The centroid may be the center of mass if data to compute the mass is available; alternately, the centroid may be the geometric center of the part assuming that the part has a uniform density. In one embodiment, functionality provided by the Parasolid®geometric modeler (available from UGS of Cypress, Calif.) computes the principal axes and the centroid of the part.

Four transformations are then created that when applied to the original part would place that part in one of the orientations (704–716) illustrated in FIG. 7 and previously discussed with reference to FIG. 7 (step 810). In one embodiment, the four transformations are 4 by 4 matrices. Each transformation contains data that translates the original part's centroid twice the distance along the normal to the plane of symmetry, thereby positioning the centroid at a symmetric location with respect to the original location. One transformation also contains data that does not rotate the part (i.e., a 0° rotation). The second, third, and fourth transformations contain data that produce a 180° rotation about the part's principal x-axis, a 180° rotation about the part's principal y-axis, and 180° about the part's principal z-axis.

Each of the four transformations is applied to the array containing the original vertices (i.e., VOA), resulting in four arrays of transformed vertices, referred to herein as VTA1, VTA2, VTA3, and VTA4 (step 812). The arrays VTA1, VTA2, VTA3, and VTA4 are sorted in the same manner as the mirrored vertex array VMA (e.g., in increasing lexical order by the values of the x-coordinate, y-coordinate, then z-coordinate). The standard deviation between each sorted array containing transformed vertices (i.e., VTA1, VTA2, VTA3, and VTA4) and the array of sorted mirrored vertex locations (i.e., VMA) is calculated (step 814), thereby producing four standard deviation results. The standard deviation results reveal how well suited each of the four transformations is for positioning a component on the opposite side of the plane of symmetry. A higher standard deviation value indicates that a transformation is more poorly suited than a transformation that produced a lower standard deviation value. The transformation used to create the array of transformed vertices that produced the lowest standard deviation with respect to VMA may be the transformation selected to replicate the part (step 816). Ideally, the lowest standard deviation would be zero (0). However, due to round-off error this is an unlikely possibility. A value of $10^{-3}$ or a value of $10^{-6}$ may be considered equal to 0 in some implementations.

All standard deviation results may be greater than 0 (or the value considered to be 0 after accounting for round-off errors). In this case, rather than creating a replicated part, creating a truly mirrored part is the better solution because the components that belong to the mirrored pair are physically different as revealed by the non-zero standard deviation results. However, the design engineer may be allowed to insist that the part be replicated, be presented with the four transformations ordered according to the standard deviation results, and be permitted to choose one of the transformations for the purpose of replicating the part.

Alternatively, if more then one standard deviation is equal to 0 (after accounting for round-off errors), multiple solutions for replicating the component exist. For example, when replicating a simple cube all four transformations yield a correct position due to the symmetry of the cube. In such a case, the present invention may use any transformation to position the replicated component.

One embodiment of the present invention completely automates the decision whether to replicate or truly mirror a part. The aforementioned process that determined which array of transformed vertices (i.e., VTA1, VTA2, VTA3, and VTA4) produced the lowest standard deviation with respect to the array VMA also determines whether to truly mirror a part. The determination is based on the result of the standard deviation calculations. If none of the standard deviation results equaled zero (0), or a number considered to be zero (0) after taking into consideration round-off errors, the parts that belong to the mirrored pair are physically different and a truly mirrored part is created, otherwise, a replicated mirrored part is created.

Figure 9A:
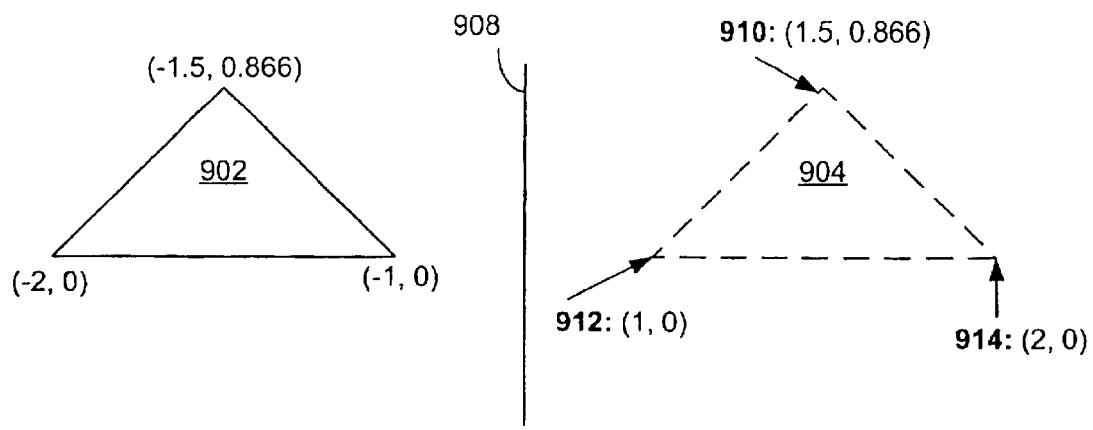
FIG. 9a is an illustration of a possible position for a replicated part.
Figure 9B:
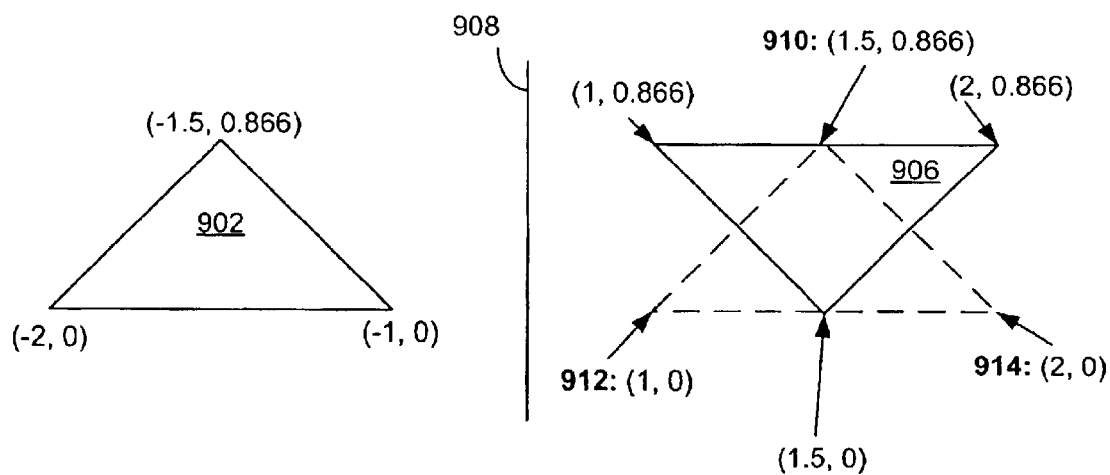
FIG. 9b is an illustration of a possible position for a replicated part.

FIG. 9a and FIG. 9b are illustrative examples of two of four possible locations that may be assumed by a replicated part. FIG. 9a shows a case where procedure 800 would produce a standard deviation of 0. FIG. 9b shows a case where procedure 800 would produce a standard deviation of 1.14. Upon understanding the cases that will be discussed with respect to FIG. 9a and FIG. 9b, those skilled in the art would be able to calculate the other two standard deviation results for the two remaining possible locations of a replicated part.

FIG. 9a illustrates a first case and shows an original object 902, a plane of symmetry 908, and computed mirrored positions 910, 912, 914 (one mirrored position for each vertex of the original object 902). As previously discussed with reference to Step 804 in FIG. 8, the computed mirrored positions 910, 912, 914 result from translating the vertices of the original object 902 twice the distance to the plane of symmetry on a path normal to the plane of symmetry. The coordinates of the vertices belonging to the original object 902 are (−1.5, 0.866), (−2, 0), and (−1, 0). A sorted list containing the computed mirrored positions 910, 912, 914 may be represented as [(1, 0) (1.5, 0.866) (2, 0)], where the list was sorted by the x values then y values of the vertices.

One possible replicated location of the original object 902 results when the principal axes of the original object 902 is not rotated (as was discussed with respect to the first orientation 704 shown in FIG. 7), and the centroid of the original object 902 is translated twice the distance along the normal to the plane of symmetry. Thus, the vertices of one possible replicated location are (1.5, 0.866), (1, 0), and (2, 0), which are identical to the computed mirrored positions 910, 912, 914. A sorted list containing the vertices of this one possible replicated location may be represented as [(1, 0) (1.5, 0.866) (2, 0)].

The standard deviation of the pairs of sorted vertices, where one member of the pair belongs to the computed mirrored positions 910, 912, 914 and the other member of the pair belongs to the one possible replicated location is $$\sigma = \sqrt{\frac{\Sigma \text{ Distance between Each Vertex Pair}}{\text{Number of Vertices} - 1}}$$

The distances between each of the three pairs of vertices are

Distance $1=\sqrt{(1-1)^2+(0-0)^2}=0$

Distance $2=\sqrt{(1.5-1.5)^2+(0.866-0.866)^2}=0$

Distance $3=\sqrt{(2-2)^2+(0-0)^2}=0$

Therefore, the standard deviation in this first case is 0.

FIG. 9b illustrates a second case and shows the original object 902, the plane of symmetry 908, the computed mirrored positions 910, 912, 914, and a second possible replicated location 906. A sorted list containing the computed mirrored positions may be represented as [(1, 0) (1.5, 0.866) (2, 0)].

The second possible replicated location 906 for the original object 902 has vertices (arranged in sorted order) [(1, 0.866) (1.5, 0) (2, 0.866)]. The second possible replicated location 906 is the result of rotating the original object 902 180° about the principal z-axis (see orientation 716 in FIG. 7), then translating the centroid of the original object 902 twice the distance to the plane of symmetry along the normal to the plane of symmetry.

The distances between each pair of the three vertices in this second case, where one member of the pair belongs to the computed mirrored positions 910, 912, 914 and the other member of the pair belongs to the second possible replicated location 906, are Distance $1=\sqrt{(1-1)^2+(0-0.866)^2}=0.866$ Distance $2=\sqrt{(1.5-1.5)^2+(0.866-0)^2}=0.866$ Distance $3=\sqrt{(2-2)^2+(0-0.866)^2}=0.866$ The standard deviation for this second case is $$\sigma = \sqrt{\frac{\Sigma \text{ Distance between Each Vertex Pair}}{\text{Number of Vertices} - 1}}$$
$$= \sqrt{(0.866 + 0.866 + 0.866)/2}$$
$$= 1.14$$

Of the two examples just discussed, the first case with no rotations is the better choice used to create the replicated part because the result of the standard deviation calculation is 0.

In one embodiment, a data structure stores the data that produces a replicated mirrored part. The data structure contains the transformation selected to replicate the part, as determined by the procedure 800. The data structure also contains a reference to the original part transformed to the coordinate system of the assembly. To display a replicated mirrored part on a CRT, the original part is transformed to the coordinate system of the assembly, then transformed to the mirrored location.

Figure 10:
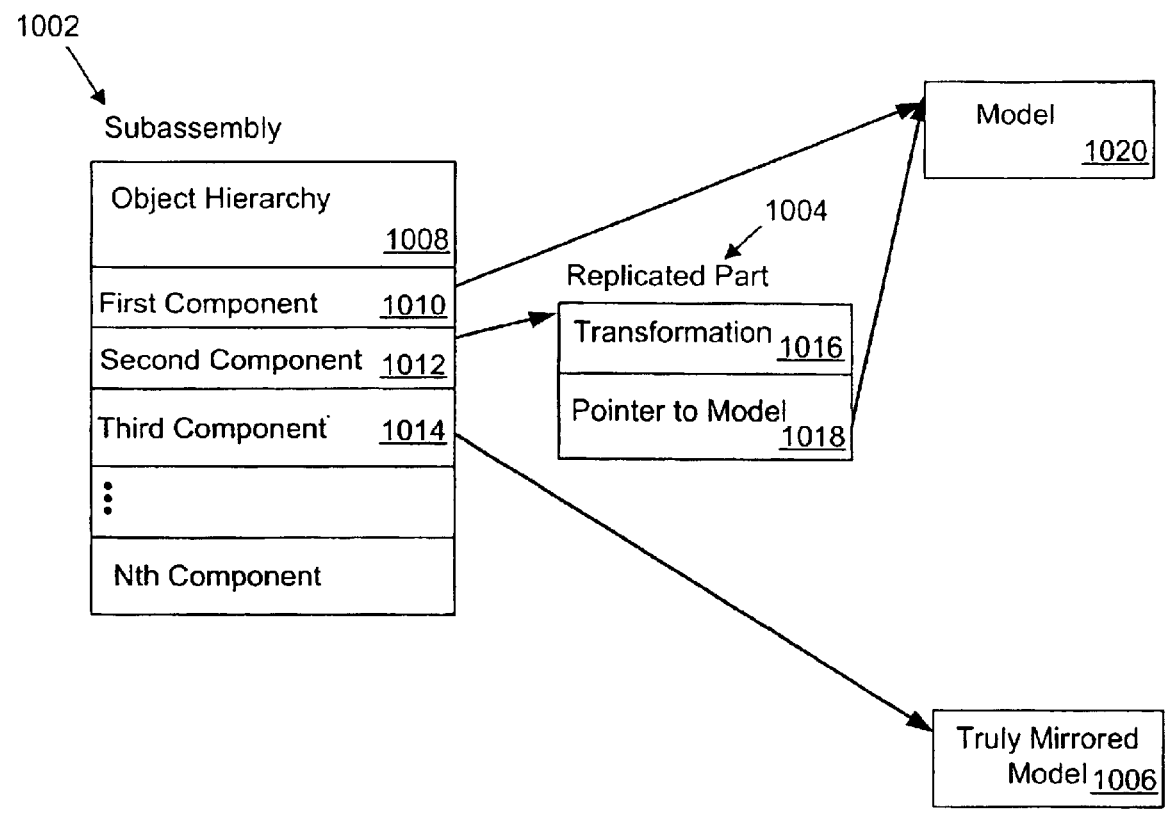
FIG. 10 is an illustration of data structures.

FIG. 10 illustrates data structures that may be implemented for truly mirrored and replicated parts. A data structure that helps define subassembly 1002 may contain data that defines an object hierarchy 1008 for subassembly 1002 and numerous components. A first component 1010 may be used to define an original part and may be a pointer to a data structure defining the geometry, among other data, of a model 1020. A second component 1012 may be used to define a replicated part and may be a pointer to a data structure representing the replicated part 1004. A third component 1014 may be used to define a truly mirrored part and may be a pointer to a data structure defining the geometry, among other data, of the truly mirrored part 1006.

The data structure representing the replicated part 1004 may contain a transformation 1016 and a pointer to a model 1018. The transformation 1016 is capable of producing a rotation and a translation. The data contained in the transformation 1016 that produces the rotation is determined by procedure 800 and discussed with reference to FIG. 8. The data that produces the translation is also determined by procedure 800 and has the affect of translating the centroid of an original part to a symmetric position with respect to a plane of symmetry. The pointer to a model 1018 is a pointer to the data structure defining the geometry for the same model 1020 used to define the original part.

The present invention may be implemented using hierarchical data structures. Hierarchical data structures can represent 3D models (including solid models) as combinations of elements such as geometry, topology, operations, transformations, assemblies, subassemblies, parts, and other model data.

Figure 11:
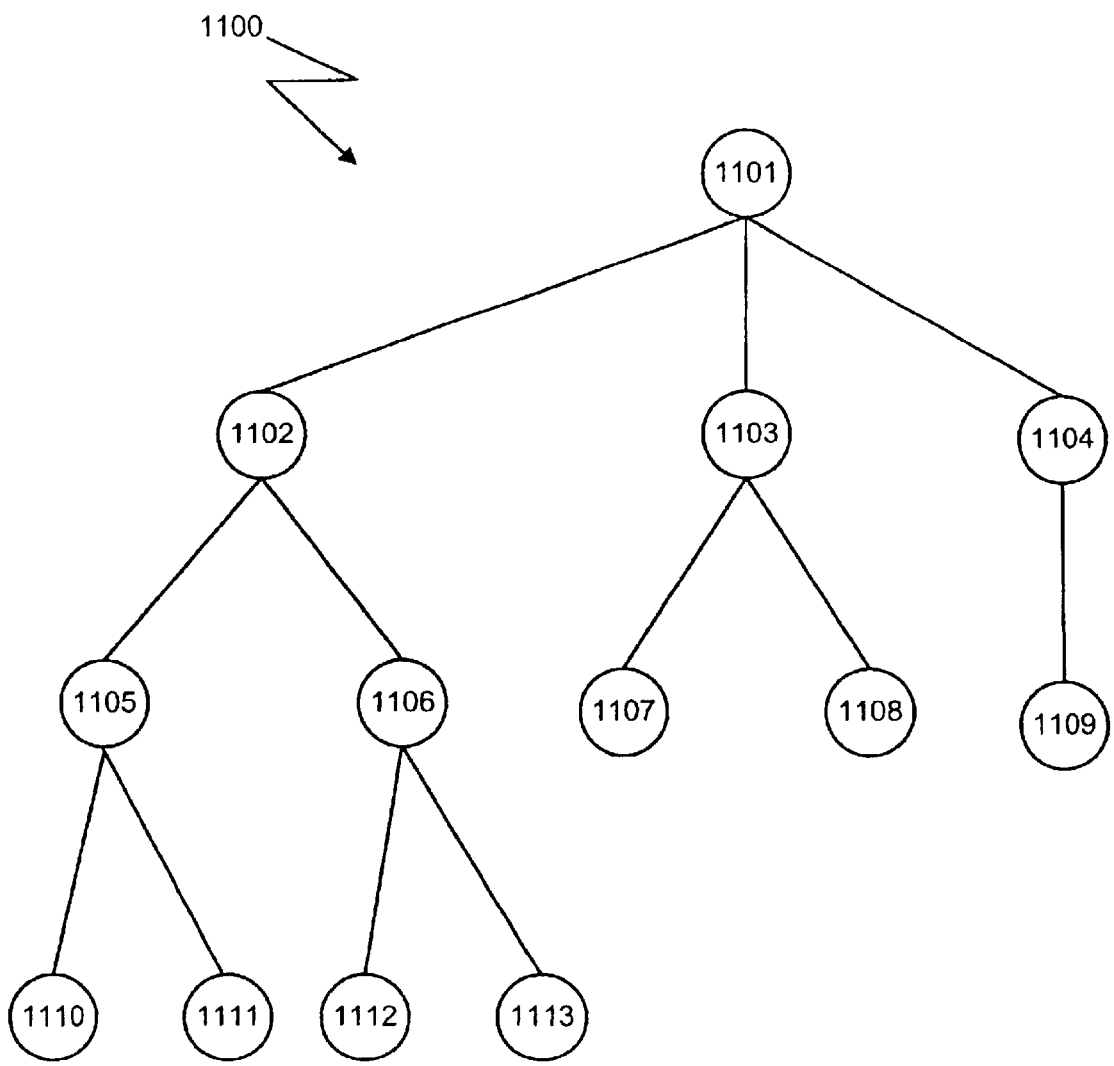
FIG. 11 is an illustration of a hierarchical data structure.

FIG. 11 shows a hierarchical data structure 1100, which also may be known as a tree structure. The hierarchical data structure 1100 includes nodes arranged in parent-child relationships that identify model components and contain relationships between modeled components. For example, node 1110 may represent one part in a model, node 1111 may represent a second part in the model, and their parent node 1105 may represent a subassembly that contains the two parts. Thus, node 1105 defines a relationship between its descendents that results in the formation of an object that is a subassembly. A modeled object may be represented by a root node 1101 and nodes 1102–1113 connected to the root node 1101. Modeling software can construct (or render) a modeled object by traversing ("walking") the nodes in the hierarchical data structure 1100. Walking the nodes 1101–1113 can include performing a breadth-first or depth-first traversal of the nodes 1101–1113 to locate descendent nodes of any given ancestor node. The model may then be constructed by performing the operations represented by the ancestor and descendent nodes.

The hierarchical structure of the original components is automatically preserved in the mirrored subassembly. The mirrored subassembly has identical structure as its parent, that is, the same number of sub-assemblies and parts. For example, node 1110 and node 1111 may be parts belonging to a subassembly represented by node 1105. Mirroring the subassembly represented by node 1105 may create a new node 1106 that represents a subassembly having node 1102 as a parent node (which is the same parent node as node 1105), and two mirrored parts represented by node 1112 and node 1113. Thus, the subassembly represented by node 1106 with descendent nodes 1112 and 1113 has identical structure to the subassembly represented by node 1105 with descendent nodes 1110 and 1111. Nodes of the hierarchy 1100 can store parametric relationships between an original and a new truly mirrored part. This parametric relationship can be used to control updating of the new mirrored part when a change is made to the original mirrored part. Copies of a part are not "true mirrors" of the part and may be implemented as instances of the same part model as the original part; therefore, updating one member of the pair causes an implicit update to the other member of the pair.

In one embodiment, the underlying data structures that support mirrored subassemblies are not only hierarchical, but are also object oriented. In an object-oriented programming environment, a class defines a set of objects that have similar data structures, properties, and methods. Objects, which are instances of particular classes, form the nodes of the hierarchical data structure. Those of ordinary skill in the art understand how to create a hierarchical data structure and how to build object-oriented data structures.

Another aspect of the present invention creates a parametric relationship between the original component and the corresponding new truly mirrored component, as previously mentioned. The parametrical relationship enables the new truly mirrored component to be re-created when the original component is modified. Features that may have been added to the new truly mirrored component are added back after the truly mirrored component is recreated. Thus, the new truly mirrored component remains consistent with the original component. This consistency function can be provided using a back pointer from the mirrored component to the original component.

A further aspect of the present invention establishes additional mating relationships. A mating relationship is a geometric relationship between components that precisely positions the components with respect to one another. A data structure that specifies a mating relationship may include pointers to the data structures that define the mated components, pointers to the data structures that define the geometric entities that will be mated (e.g., a face in one component and an edge in the other), and a description of the type of geometrical relationship between the components (e.g., tangent or parallel). To illustrate, the design engineer may create a parallel mating relationship between a planar face of one component within an assembly and a planar face of another component within the same assembly. If an action causes either one of the components to be repositioned, the other component is automatically repositioned to satisfy the constraint specified by the parallel mating relationship. In addition to parallel mating relationships, several other types of mating relationships are supported by the present invention, including angle, coincident, concentric, distance, perpendicular, and tangent mating relationships.

Commercial products are available that solve the constraints imposed by a mating relationship. One such product is the 3D Dimensional Constraint Manager (3D DCM) product available from D-Cubed Limited of Cambridge, England. One skilled in the art understands how to create a mating relationship between components and how to use a product, such as 3D DCM, to reposition geometric entities according to the specified geometric relationship.

The present invention establishes mating relationships between components created by a mirror operation that correspond to the mating relationships in the original non-mirrored assembly to the furthest extent possible. Thus, mating relationships may be retained in the original components' mirrored counterparts thereby preserving the engineer's design intent (e.g., the positional dependency between two components) in addition to freeing the design engineer from recreating the mating relationships. (The case where only one component of a mating relationship is mirrored is a situation that does not produce a corresponding mating relationship; although, a symmetric mating relationship is established, which will later be discussed.)

Although the original mated components and the new mated components have the same type of geometrical relationship (e.g., tangent, coincident, or perpendicular), the particular geometric entities chosen to share the mating relationship depend on the way in which the original mated components are mirrored. The present invention determines which geometric entities to mate and bases the determination upon whether the new mated components are two truly mirrored components, two replicated components, or a truly mirrored component and a replicated component.

If two original components are mated and both are truly mirrored, the two new truly mirrored components are mated in a similar manner as the original components. The geometric entities mated in the two new truly mirrored components are the reflected versions of the geometric entities that are mated in the original components. For example, when a face in one original part and a face in a second original part are mated, the corresponding reflected mirrored faces in the new truly mirrored parts are also mated.

A more complex mating situation occurs when two components are mated, one of the two components is truly mirrored, and the other one of the two components is replicated. In the new truly mirrored component, the mated geometric entity is the reflected version of the geometric entity mated in the corresponding original component. In the new replicated component, the mated geometric entity is determined after searching for a suitable geometric entity in the new replicated component.

The data structure that specifies the mating relationship between the new truly mirrored component and the new replicated component may include the following. First, the data structure may include a pointer to the new truly mirrored component, and second, include a pointer to the new replicated component. Third, the data structure may include a pointer to the geometric entity in the new truly mirrored component that is the reflected version of the mated geometric entity in the corresponding original component. Fourth, a pointer to a suitable geometric entity in the new replicated component may be included in the data structure. This suitable geometric entity must be the same type of geometric entity as that which is mated in the corresponding original component (e.g., a face). Lastly, a description of the type of geometric relationship may be included in the data structure, which will be the same type as that in the original mated components (e.g., parallel or tangent).

Figure 12:
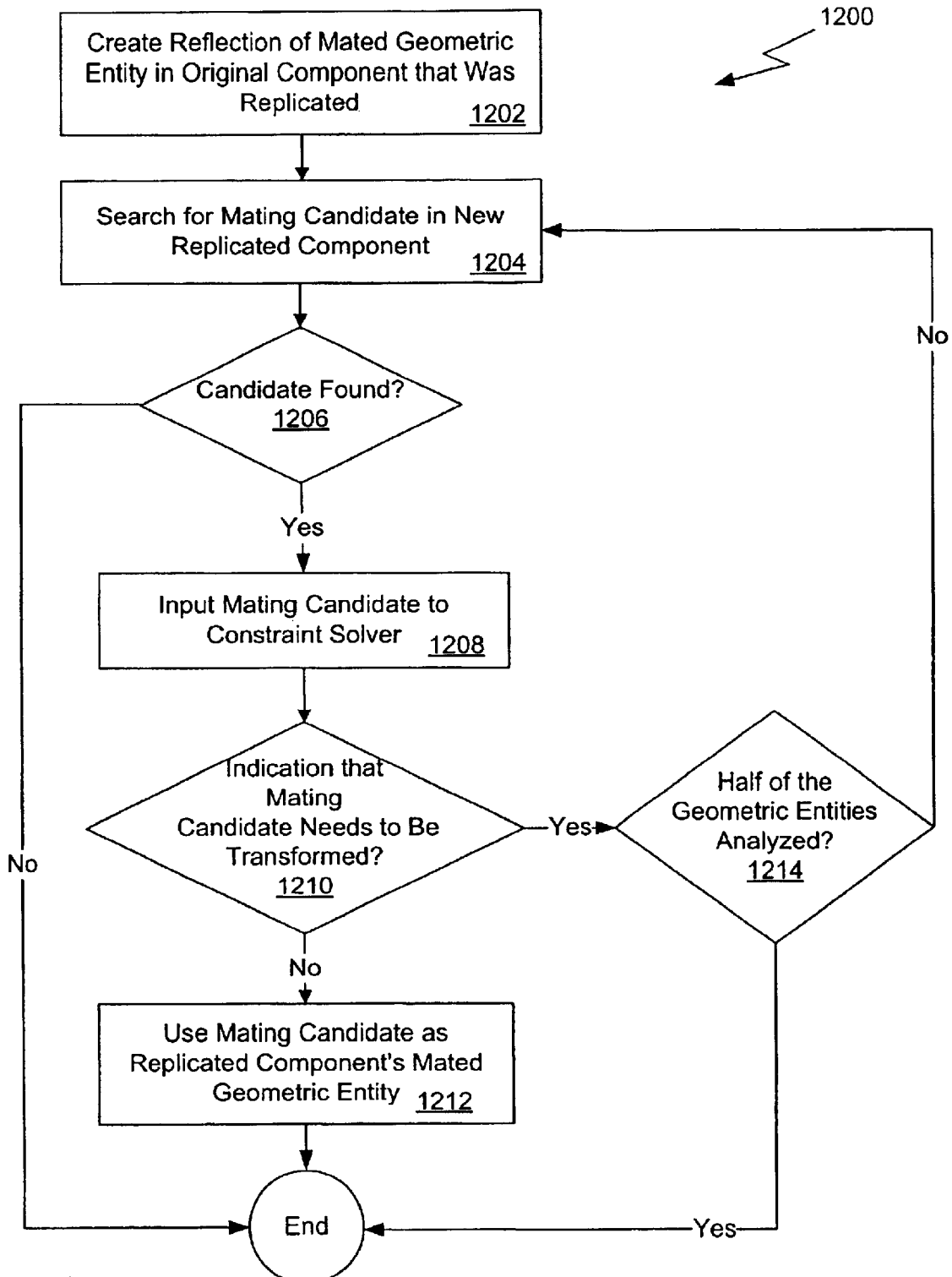
FIG. 12 is a flowchart of a search procedure.

Referring now to FIG. 12, a procedure 1200 determines which geometric entity in a new replicated component to mate with a geometric entity in a new truly mirrored component. A replicated component is likely to have symmetrical qualities, which may be the reason that the design engineer or automated process (discussed with reference to FIG. 8) decided to replicate rather than truly mirror the component. Therefore, a reflection of the mated geometric entity in the original component that was replicated should share similarities with a geometric entity that is a mating candidate in the new replicated component.

To begin, procedure 1200 creates a reflection of (i.e., truly mirrors) the geometric entity that is mated in the original component that was replicated (step 1202). For example, if an edge is a mated geometric entity in the original component, that edge is reflected about the plane of symmetry by translating the edge in the direction initially toward the plane of symmetry on a path that is normal to the plane of symmetry, and by an amount equal to twice the distance to the plane of symmetry.

Next, procedure 1200 searches for a geometric entity in the new replicated component that is a mating candidate (step 1204). A mating candidate will be similarly positioned with respect to the reflected version of the originally mated geometric entity, hereinafter referred to as the "reflected entity." Additionally, a mating candidate will be the same type of entity as the reflected entity. For example, if the reflected entity is an edge, procedure 1200 will search for an edge in the new component that has the same or a reasonably close position to the reflected edge. The search for a mating candidate entails comparing the reflected version of the originally mated geometric entity to one or more geometric entities in the new replicated component.

A mating candidate may have the same position as a position in the reflected entity, or may have a position that is reasonably close to a position in the reflected entity. Therefore, the search for a mating candidate determines whether any geometric entities (of the type to be mated) in the replicated component share a common position with, or have a position reasonably close to, the reflected entity. Such a position will hereinafter be referred to as an appropriate position.

A ray-shooting technique may be used to determine whether a geometric entity in a new replicated component has the same position as (or a reasonably close position to) the reflected entity. A ray-shooting technique creates a direction vector and searches for two vertices located on the path of the direction vector. One of the vertices must belong to the reflected entity and the other one of the vertices must belong to a geometric entity in the new replicated component (of the same type as in the original mated replicated component). If such two vertices are found, the vertices are considered to be at the same position. In one implementation, the direction vector originates at an arbitrary point belonging to the reflected entity, has an inward direction, and is normal to the reflected entity. If a common location is not found, successive points in the reflected entity are used for the origin of the direction vector and/or other replicated geometric entities of the same type are used in the search.

An alternative method for searching for an appropriate position may implement a lexigraphical sorting technique. In this case, the vertices of the reflected entity and the vertices in the new replicated component that belong to the same type of geometric entity as the reflected entity (e.g., point, line, surface, face, edge) are compared after being sorted in increasing lexical order by the values of the x-coordinate, y-coordinate, then z-coordinate. If the vertices in the reflected entity are similarly positioned to the vertices in the geometric entity in the new replicated component, the geometric entity is a mating candidate.

Commercially available products may also be utilized to locate a mating candidate. For example, the Parasolid geometry kernel has the capability of returning the closest point to a given point. Given the closest point, the geometric entity to which the closet point belongs may easily be determined. Thus, the closest point in the new replicated component to a vertex in the reflected entity may be retrieved. Then, the geometric entity to which the closest point belongs may be analyzed to determine if that geometry entity has an appropriate position and may be a mating candidate.

For the geometric entity to be a mating candidate, the geometric entity must be the same type of geometric entity (e.g., edge or face) as that of the geometric entity mated in the original component that was replicated. Thus, procedure 1200 may determine whether a mating candidate is found (step 1206) by finding a particular type of geometric entity in an appropriate position.

A geometric entity that is a mating candidate is used as input to a constraint solver (step 1208) along with the reflected entity. The constraint solver outputs a transformation that specifies how to position the candidate geometric entity so that it is coincident with the reflected entity. If the resulting transformation output by the constraint solver indicates that the mating candidate does not need to be transformed (step 1210), the mating candidate may be selected as the geometric entity in the replicated component to mate (step 1212). Some implementations may consider a transformation that would cause the mating candidate to move a minimal amount an acceptable result for concluding that the mating candidate is a suitable mate.

If the resulting transformation does not indicate that the mating candidate may be selected as the geometric entity in the replicated component to mate, procedure 1200 continues to check other geometric entities for a suitable mate. Rather than check all geometric entities of the same type as that in the original mate, the search procedure may be shortened by sub-dividing the area to be searched. For example, a component's data structure may be in the form of a b-tree. In this case, the procedure 1200 may easily determine that some subset of geometric entities (e.g., half) in the new replicated component have been analyzed as a possible mate (step 1214). Then, if that entire subset has not been analyzed, procedure 1200 continues to search for a mating candidate in the new replicated component (step 1204).

When two original components are mated and both are replicated, a more complex search than that discussed in reference to FIG. 12 is performed. Two reflected entities are created, one for each mated entity in the original mated components. The present invention then searches for a suitable mate with respect to one reflected component and then with respect to the other reflected component.

When a component has no mating relationship or when only one component in a mated pair is mirrored, the present invention may create a symmetric mating relationship between the original component and the mirrored component created from the original component. (Hereinafter the original component and the mirrored component created from the original component may be referred to as the mirrored component pair, or simply the mirrored pair.) This symmetric mating feature enables one component in the mirrored component pair to be repositioned with respect to the plane of symmetry when the other component in the mirrored pair is repositioned. The symmetric mating relationship may be implemented as a data structure that contains references (e.g., pointers) to a geometric entity belonging to the original component, a corresponding geometric entity belonging to the other component in the mirrored pair, and a plane of symmetry.

When a symmetric relationship is established, transforming either component in the mirrored pair causes the other component to be automatically repositioned so that the geometric entities that are referenced in the mirrored pair appear in symmetric locations with respect to the plane of symmetry. For example, if one component in the mirrored pair is translated toward the plane of symmetry, the other component in the mirrored pair is translated toward the plane of symmetry by an equal distance. Likewise, if one component in the mirrored pair is rotated, the other component in the mirrored pair is rotated in such a way that the mated geometric entities are the same distance from the plane of symmetry and symmetrically oriented.

A symmetric mating relationship is a constraint similar to other mating relationships. The 3D DCM product previously discussed may also be used to solve the constraints imposed by the symmetric mating relationships.

One skilled in the art should appreciate that automatic creation of mirrored components saves a design engineer a considerable amount of time and effort when he or she wants to create a mirrored version of a part or subassembly. The present invention provides substantial automation where a great deal of manual intervention was previously necessary, including intelligently determining whether and how to re-use a part. The present invention produces a model that generates a correct bill of materials for manufacturing. Additionally, the present invention automatically generates the necessary relationships (e.g., mating relationships) to maintain the mirrored subassembly during the iterative design process in accordance with the designer's intent.

The invention may be implemented in digital electronic circuitry, or in computer hardware, firmware, software, or in combinations thereof. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or an interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

A number of embodiments of the present invention have been described. Nevertheless, it will be understood that various modifications may be made without departing from the spirit and scope of the invention. For example, the design engineer may select a component that was previously mirrored in the context of another assembly and re-use the mirrored part. Mating relationships may be established between a new component created by one mirror operation and a new component created by a subsequent mirror operation. Additionally, the present invention may be tightly integrated with Product Data Management (PDM) systems to ensure that a part created by a mirror operation is automatically named in accordance with a company policy.

Implementations may change the order in which operations are performed. For example, in FIG. 8, operations 802–806 may be performed immediately after operations 808 and 810 and then followed by operation 812. Depending on the needs of an implementation, particular operations described herein may be implemented as a combined operation, eliminated, added to, or otherwise rearranged. Accordingly, other embodiments are within the scope of the following claims.

What is claimed is:

1. A computer-implemented method of mirroring a component of a three-dimensional object modeled in a computer-simulated three-dimensional modeling space, the method comprising:

receiving data to select a first component of the three-dimensional object;

applying a plurality of transformations to the first component to determine a plurality of candidate orientations;

automatically analyzing the plurality of candidate orientations to select a preferred orientation for creation of a reproduction of the first component;

selecting one of a plurality of procedures for constructing a new component, the plurality of procedures comprising a truly mirrored copy procedure and a copy procedure, the copy procedure utilizing one of the plurality of transformations; and creating the new component of the three-dimensional object that is the reproduction of the first component in the preferred orientation, the new component being created using the selected procedure and being created based on a position of the first component with respect to a surface said surface comprising a plane of symmetry positioned in the three-dimensional modeling space and wherein said surface is not a component of the three-dimensional object.

2. A computer-readable data storage apparatus comprising instructions for configuring a computer system to perform the method of claim 1.

3. The method of claim 1 further comprising receiving input from a user to position the surface in the three-dimensional modeling space.

4. The method of claim 1 wherein:

the surface comprises a plane logically separating the modeling space into a first and a second section; and the first component is positioned in the first section of the modeling space; and creating the new component comprises creating the new component in the second section.

5. The method of claim 4 wherein:

the first component comprises a first plurality of vertices; and creating the new component comprises determining a second plurality of vertices, each vertex in the second plurality corresponding to a vertex in the first plurality, and each vertex in the second plurality being determined based on a position of said corresponding vertex with respect to the plane.

6. The method of claim 4 wherein creating comprises creating such that the first and the new component are in symmetrical positions with respect to the plane.

7. The method of claim 1 wherein:

the first component comprises a plurality of first sub-components; and creating the new component comprises creating a plurality of new sub-components, each of the new sub-components corresponding to one of the first sub-components.

8. The method of claim 7 wherein:

applying the plurality of transformations comprises applying a plurality of transformations to each of the first sub-components to determine the plurality of candidate orientations of each corresponding new sub-component; and wherein the method further comprises analyzing each of the candidate orientations of each of the new sub-components to determine existence of a candidate orientation meeting a predetermined selection criteria indicative of a preferred transformation.

9. The method of claim 8 further comprising:

based on said predetermined selection criteria, determining ones of the new sub-components that are to be created as truly mirrored sub-components and ones of the new sub-components to be created as replicated components.

10. The method of claim 9 further comprising generating a bill of materials wherein:

for each of the first sub-components that is reproduced as a truly mirrored sub-component, said first sub-components and said truly mirrored sub-components are represented in the bill of materials as different line items; and for each of the first sub-components that is reproduced as a replicated sub-component, said first sub-components and said replicated sub-components are represented in the bill of materials as instances of the same line item.

11. A computer-implemented method for generating components of an object modeled in a three-dimensional modeling space provided by a computer aided design system, the method comprising:

positioning a plane in the three-dimensional modeling space to logically subdivide the modeling space into a first division comprising a first component and a second division in which a reproduction of the first component is to be located and to define a reference geometry for creation of the reproduction of the first component, wherein said plane is not a component of the object modeled in the three-dimensional modeling space;

computing a plurality of geometrically transformed components by applying a plurality of different transformations to the first component, each transformed component comprising a different orientation of the first component; and constructing the reproduction of the first component based on one of the plurality of geometrically transformed components such that the first component and the reproduction are symmetrical to each other with respect to the plane;

wherein each one of the plurality of different transformations comprises a transformation positioning a principal axes and a centroid of the first component at a position in the second division of the modeling space and is symmetric to the position of a principal axes and centroid of the first component.

12. A computer-readable data storage apparatus comprising instructions for configuring a computer system to perform the method of claim 11.

13. The method of claim 11 wherein constructing the reproduction comprises:
determining a preferred geometric transformation of the first component for use in constructing the reproduction by comparing locations of geometric features of the transformed components.

14. The method of claim 13 wherein:
the first component comprises a plurality of sub-components;
computing the plurality of geometrically transformed components comprises, for each one of the plurality of sub-components, applying a plurality of transformations to said each one of the plurality of sub-components; and
determining a preferred geometric transformation comprises determining for each one of the plurality of sub-components a manner in which to construct a corresponding reproduction.

15. The method of claim 14 wherein the manner in which to construct the corresponding reproduction is selected from the group consisting of generating a truly mirrored component and generating a replicated component.

16. The method of claim 15 further comprising generating a bill of materials comprising a plurality of line items, the bill of materials being generated such that:
a first one of the first plurality of sub-components and a corresponding truly mirrored component are represented as different line items; and
a second one of the first plurality of sub-components and a corresponding replicated component are represented by different instances of the same line item.

17. The method of claim 13 wherein:
the first component comprises a first plurality of vertices;
comparing locations of geometric features comprises comparing locations of vertices;
comparing locations of vertices comprises:
computing a plurality of mirrored vertices, each mirrored vertex corresponding to one of the first plurality of vertices, such that each mirrored vertex and said corresponding one of the first plurality of vertices are equidistant to the plane and positioned on different sides of the plane; and
for each one of the transformed components, computing an acceptance value based on a difference between locations of vertices of the transformed component and locations of the plurality of mirrored vertices, the acceptance value indicative of a preferred transformation.

18. The method of claim 17 wherein the acceptance value is a standard deviation value and the method further comprises determining a preferred geometric transformation by comparing the standard deviation value for each of the transformed components to a predetermined criteria indicative of a preferred transformation.

19. The method of claim 11 further comprising:
storing a data structure associating the first component and the reproduction; and
initiating an update of the reproduction in response to a change in the structure of the first component.

20. The method of claim 14 further comprising:
logically integrating the reproduction into the modeled object such that the modeled object comprises both the first component and the reproduction; and
storing a data structure to establish a mating relationship between the corresponding reproduction of a first one of the plurality of sub-components and the corresponding reproduction of a second one of the plurality of sub-components, said data structure comprising data to initiate a corresponding positional transformation of the corresponding reproduction of the first one of the plurality of sub-components in response to a positional transformation of the corresponding reproduction of the second one of the plurality of sub-components.

21. The method of claim 20 wherein:
the mating relationship comprises a type selected from a group consisting of parallel, angle, coincident, concentric, distance, perpendicular, and tangent.

22. The method of claim 20 further comprising:
automatically creating the mating relationship to mate a geometric feature of the corresponding reproduction of the first one of the plurality of sub-components with a corresponding geometric feature of the corresponding reproduction of the second one of the plurality of sub-components.

23. A computer-aided design system for processing data representing construction of a three-dimensional object, the system comprising:
a processing unit coupled to a program storage medium, the program storage medium comprising instructions to configure the processor to:
calculate a plurality of orientations for a first component with respect to a plane of symmetry, wherein said plane of symmetry is not a component of the constructed three-dimensional object, each one of the plurality of orientations comprised of a plurality of vertices;
calculate a plurality of reflected vertices for the first component;
compute a plurality of standard deviation values, one deviation value computed for the plurality of vertices of each one of the plurality of orientations and the plurality of reflected vertices; and
construct a first reproduction of the first component in a manner determined by the plurality of deviation values.

24. The system of claim 23, wherein the program storage medium further comprises instructions to configure the processor to:
compute one of the plurality of deviation amounts equal to a result considered zero; and
construct the first reproduction by replicating the first component.

25. The system of claim 23 wherein the program storage medium further comprises instructions to configure the processor to:
compute the plurality of deviation amounts equal to a result considered non-zero; and
construct the first reproduction by reflecting the first component.

26. The system of claim 25 wherein the instructions to configure the processor to calculate the plurality of orientations for the first component comprises instructions to:
construct a plurality of transformations; and
apply each one of the plurality of transformations to a plurality of geometric features of the first component.

27. The system of claim 23 wherein the program storage medium further comprises instructions to configure the processor to:
- build a hierarchical data structure comprising a hierarchical relationship between the first component and a second component;
- construct a second reproduction, the second reproduction symmetrically positioned with respect to the second component and the plane;
- include the first reproduction and the second reproduction in the hierarchical data structure; and
- establish the hierarchical relationship between the first reproduction and the second reproduction.

28. The system of claim 23 wherein the program storage medium further comprises instructions to configure the processor to:
- create a mating relationship between the first reproduction and a second reproduction corresponding to a second component.

29. The system of claim 28 wherein the program storage medium further comprises instructions to configure the processor to:
- determine a first geometric entity belonging to the first reproduction, the first geometric entity similarly positioned to a reflected first mated geometric entity belonging to the first component;
- determine a second geometric entity belonging to the second reproduction, the second geometric entity similarly positioned to a reflected second mated geometric entity belonging to the second component; and
- define the mating relationship using the first geometric entity and the second geometric entity.

* * * * *